(12) United States Patent
Kim et al.

(10) Patent No.: US 11,038,005 B2
(45) Date of Patent: Jun. 15, 2021

(54) ORGANIC LIGHT EMITTING DIODE DISPLAY

(71) Applicant: SAMSUNG DISPLAY CO., LTD., Yongin-si (KR)

(72) Inventors: Gun Hee Kim, Hwaseong-si (KR); Sang Ho Park, Hwaseong-si (KR); Ju Won Yoon, Suwon-si (KR); Seung Chan Lee, Hwaseong-si (KR); Joo Hee Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/549,638

(22) Filed: Aug. 23, 2019

(65) Prior Publication Data
US 2020/0105854 A1   Apr. 2, 2020

(30) Foreign Application Priority Data

Oct. 1, 2018 (KR) .......................... 10-2018-0116734

(51) Int. Cl.
*H01L 51/52* (2006.01)
*H01L 27/32* (2006.01)
*H01L 51/50* (2006.01)

(52) U.S. Cl.
CPC ...... *H01L 27/3272* (2013.01); *H01L 27/3211* (2013.01); *H01L 27/3246* (2013.01); *H01L 51/504* (2013.01); *H01L 51/5253* (2013.01); *H01L 51/5284* (2013.01)

(58) Field of Classification Search
CPC ............. H01L 27/3272; H01L 27/3211; H01L 27/3246; H01L 51/504; H01L 51/5253; H01L 51/5284; H01L 51/50–56; H01L 51/0032–0095; H01L 27/32–3297; H01L 2251/50–568; H01L 51/5278; H01L 51/5256; H01L 27/3258; H01L 27/3248
See application file for complete search history.

(56) References Cited

U.S. PATENT DOCUMENTS

| | | | |
|---|---|---|---|
| 2004/0246432 A1 | 12/2004 | Tsuchiya et al. | |
| 2016/0248050 A1* | 8/2016 | Kim | ...................... C23C 14/243 |
| 2018/0019411 A1* | 1/2018 | Otsuki | .................... C09D 11/38 |
| 2018/0122868 A1* | 5/2018 | Kim | ....................... H01L 27/322 |
| 2019/0189704 A1* | 6/2019 | Yang | ..................... H01L 27/326 |
| 2020/0077200 A1* | 3/2020 | Lim | ..................... H04R 1/2857 |
| 2020/0118477 A1* | 4/2020 | Choi | ..................... H01L 27/326 |

FOREIGN PATENT DOCUMENTS

KR   10-2018-0035512 A   4/2018

* cited by examiner

*Primary Examiner* — Shahed Ahmed
(74) *Attorney, Agent, or Firm* — Kile Park Reed & Houtteman PLLC

(57) ABSTRACT

An organic light emitting diode (OLED) display includes a first electrode, a pixel defining layer that at least partially exposes the first electrode, an organic light emitting layer on the first electrode, a thin-film encapsulation layer on the organic light emitting layer, and a light shielding member on the thin-film encapsulation the light shielding member overlapping the pixel defining layer. The organic light emitting layer includes a main area not overlapping the pixel defining layer and a sub area overlapping the pixel defining layer. The main area includes an open portion not overlapping the light shielding member and a shadow portion around the open portion overlapping the light shielding member.

20 Claims, 12 Drawing Sheets

FIG. 1

ORGANIC LIGHT EMITTING DIODE DISPLAY

Korean Patent Application No. 10-2018-0116734, filed on Oct. 1, 2018, in the Korean Intellectual Property Office, and entitled: "Organic Light Emitting Diode Display," is incorporated by reference herein in its entirety.

BACKGROUND

1. Field

Embodiments relate to an organic light emitting diode (OLED) display.

2. Description of the Related Art

Organic light emitting diode (OLED) displays are a kind of self-luminous display. An OLED display includes an organic light emitting layer interposed between a pixel electrode and a counter electrode. When the two electrodes respectively inject electrons and holes into the organic light emitting layer, the electrons and the holes combine together to form excitons, and light is generated as the excitons fall from an excited state to a ground state.

SUMMARY

Embodiments are directed to an organic light emitting diode (OLED) display including a first electrode, a pixel defining layer that at least partially exposes the first electrode, an organic light emitting layer on the first electrode, a thin-film encapsulation layer on the organic light emitting layer, and a light shielding member on the thin-film encapsulation the light shielding member overlapping the pixel defining layer. The organic light emitting layer includes a main area not overlapping the pixel defining layer and a sub area overlapping the pixel defining layer. The main area includes an open portion not overlapping the light shielding member and a shadow portion overlapping the light shielding member and disposed around the open portion.

The pixel defining layer and the light shielding member may overlap each other such that the cross-sectional center of the pixel defining layer matches that of the light shielding member. The width of the pixel defining layer may be less than that of the light shielding member.

The width of the pixel defining layer may be about 3 μm to about 5 μm.

The width of the shadow portion may be about 6.5 μm to about 7.5 μm.

The organic light emitting layer may include a first organic light emitting layer emitting red light, a second organic light emitting layer emitting green light, and a third organic light emitting layer emitting blue light.

In the sub area, any one of the first through third organic light emitting layers may be on a side surface and an upper surface of the pixel defining layer. Another one of the first through third organic light emitting layers may be on another side surface and the upper surface of the pixel defining layer.

In the sub area, any one of the first through third organic light emitting layers may be on both side surfaces and an upper surface of the pixel defining layer. Another one of the first through third organic light emitting layers may be on both side surfaces and the upper surface of the pixel defining layer.

The first through third organic light emitting layers may overlap each other in the sub area.

The shadow portion and the sub area may change to non-light emitting areas as time elapses.

The width of the light shielding member may increase in proportion to the thickness of the thin-film encapsulation layer.

Embodiments are directed to an OLED display including a first electrode, a pixel defining layer that at least partially exposes the first electrode, an organic light emitting layer that is on the first electrode, a thin-film encapsulation layer that is on the organic light emitting layer, and a light shielding member that is on the thin-film encapsulation layer and overlaps the pixel defining layer. The organic light emitting layer includes a main area not overlapping the pixel defining layer and a sub area overlapping the pixel defining layer, the main area including an open portion not overlapping the light shielding member and a shadow portion overlapping the light shielding member and located around the open portion, wherein the open portion is a strong light emitting area. Each of the shadow portion and the sub area is a weak light emitting area having a lower emission intensity than the strong light emitting area.

The emission intensity of the shadow portion may be greater than that of the sub area.

The emission intensity of each of the shadow portion and the sub area may decrease as the distance from the open portion increases.

Embodiments are also directed to an OLED display including a first electrode, a pixel defining layer that at least partially exposes the first electrode, an organic light emitting layer on the first electrode, the organic light emitting layer including a first light emitting layer and a second light emitting layer, a thin-film encapsulation layer on the organic light emitting layer, and a light shielding member on the thin-film encapsulation, the light shielding member overlapping the pixel defining layer. The organic light emitting layer may include a main area not overlapping the pixel defining layer and a sub area overlapping the pixel defining layer. The main area may include an open portion not overlapping the light shielding member and a shadow portion overlapping the light shielding member and located around the open portion.

The organic light emitting layer may further include a charge generation layer between the first light emitting layer and the second light emitting layer.

Light emitted from the first light emitting layer and light emitted from the second light emitting layer may have a same color and have different peak wavelength ranges.

The pixel defining layer and the light shielding member may overlap each other such that the cross-sectional center of the pixel defining layer matches that of the light shielding member. The width of the pixel defining layer may be less than that of the light shielding member.

The width of the pixel defining layer may be about 3 μm to about 5 μm.

The width of the shadow portion may be about 6.5 μm to about 7.5 μm.

The shadow portion and the sub area may change to non-light emitting areas as time elapses.

BRIEF DESCRIPTION OF THE DRAWINGS

Features will become apparent to those of skill in the art by describing in detail exemplary embodiments with reference to the attached drawings in which:

FIG. 1 illustrates a schematic view of an organic light emitting diode (OLED) display according to an embodiment;

DETAILED DESCRIPTION

Figure 2:
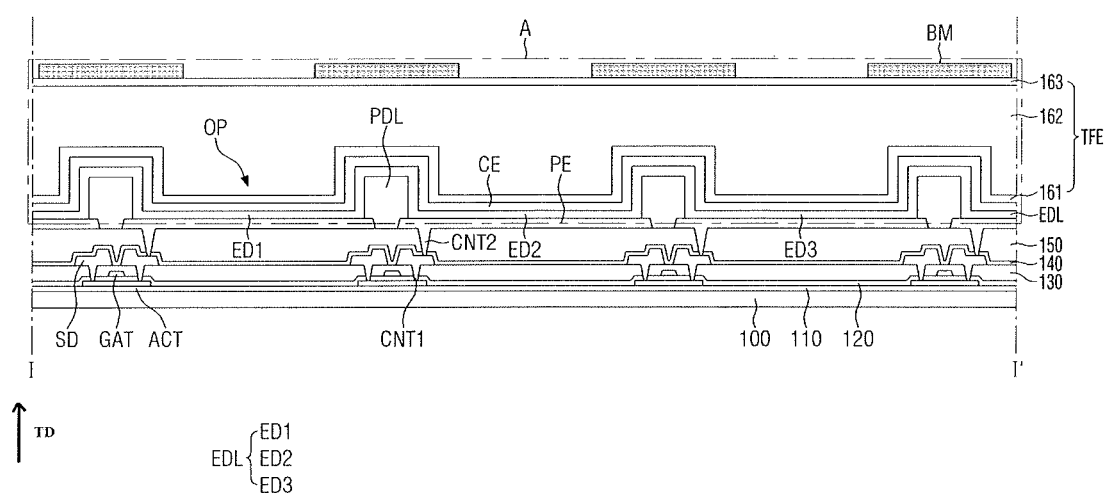
FIG. 2 illustrates a cross-sectional view of the OLED display according to the embodiment, taken along line I-I' of FIG. 1.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Where an element is described as being is related to another element such as being "directly on" another element or "located directly on" a different layer or a layer, indicates a case where an element is located on another element or a layer with no intervening element or layer therebetween. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 1:
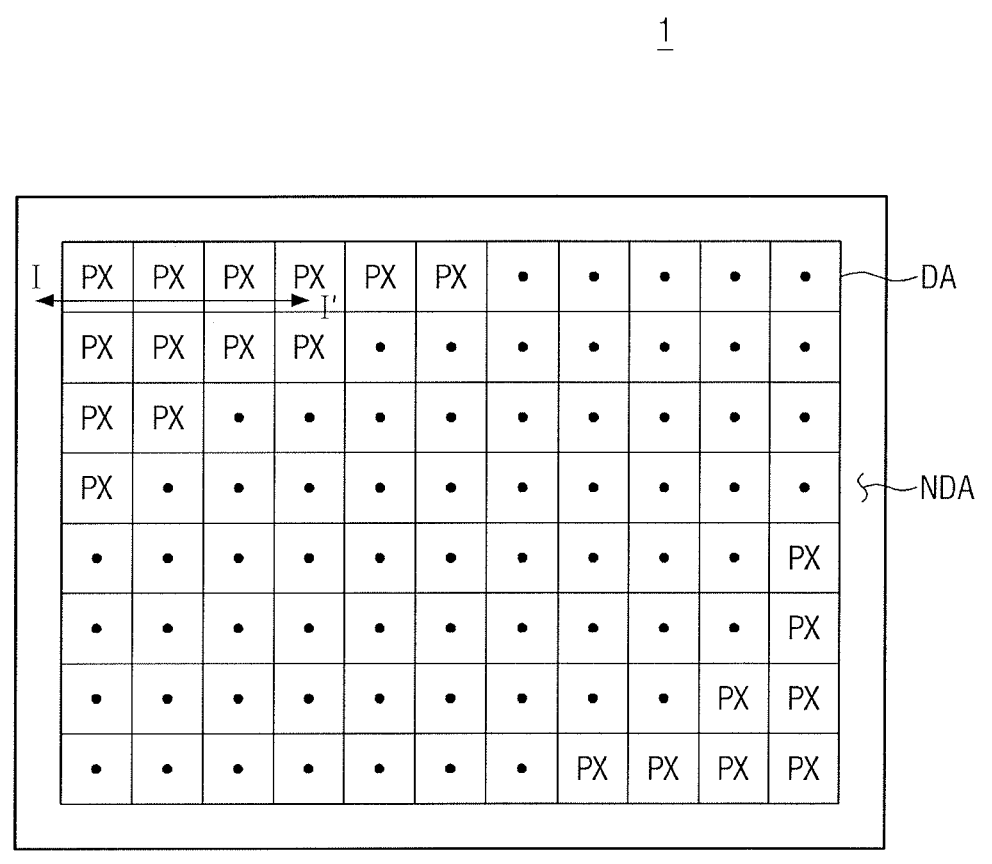

FIG. 1 illustrates a schematic view of an organic light emitting diode (OLED) display 1 according to an embodiment.

Referring to FIG. 1, the OLED display 1 may include a display area DA and a non-display area NDA. The display area DA may be in a central part of the OLED display 1. The display area DA may include a plurality of pixels PX. Each of the pixels PX may emit light of a unique color. In an embodiment, the pixels PX may include red pixels, green pixels, and blue pixels.

The non-display area NDA may be around the display area DA, for example, in a periphery thereof. The non-display area NDA may include a driver. The driver may provide electrical signals such as data signals or scan signals to the display area DA.

Figure 3:
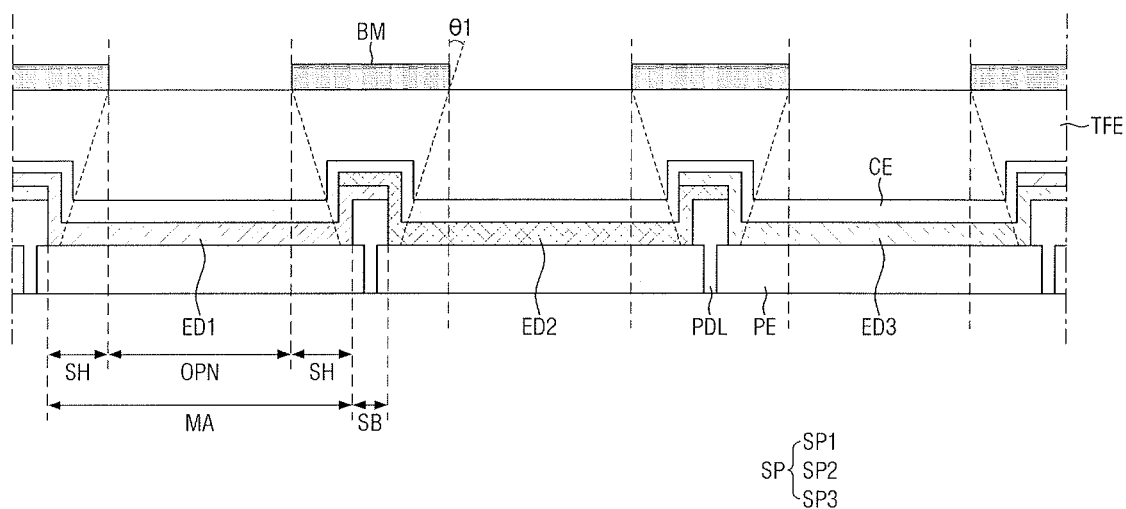
FIGS. 3 and 4 illustrate enlarged views of an OLED display according to an embodiment, taken along area A of FIG. 2.
Figure 4:
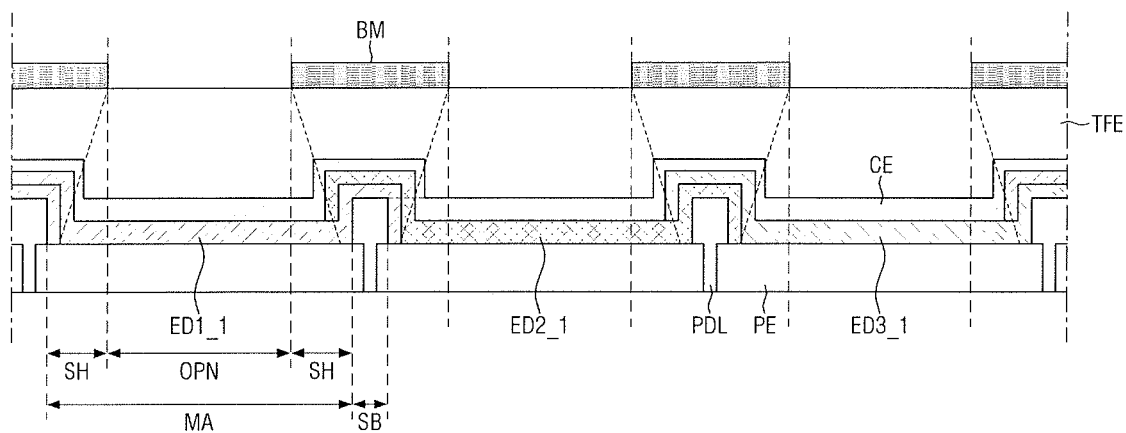
Figure 5:
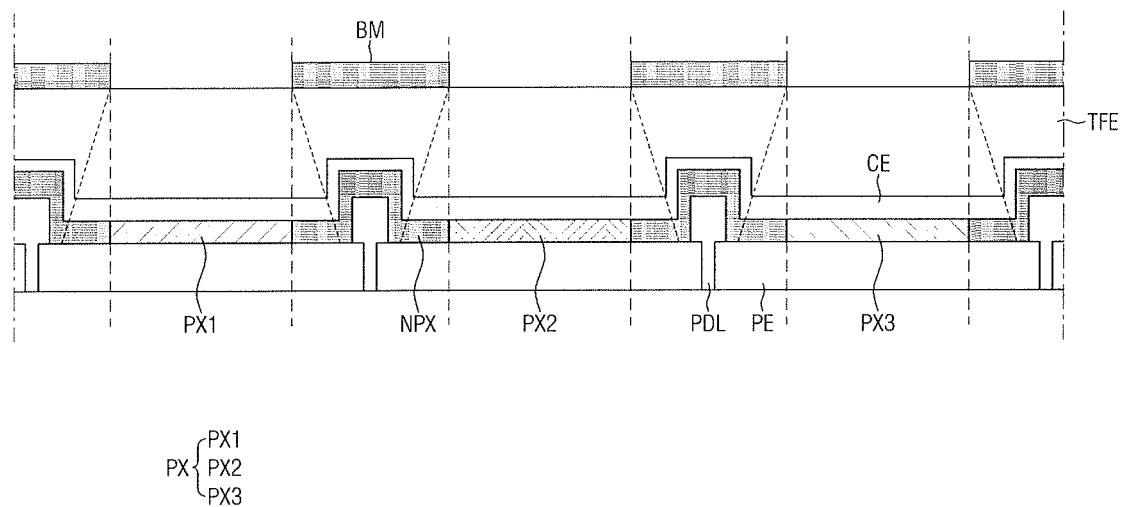
FIG. 5 illustrates a change in the OLED display of FIG. 3 or 4 over time.

FIG. 2 illustrates a cross-sectional view of the OLED display 1 taken along line I-I' of FIG. 1. FIGS. 3 and 4 illustrate enlarged views of an OLED display 1 according to an embodiment, taken along area A of FIG. 2. FIG. 5 illustrates a change in the OLED display 1 of FIG. 3 or FIG. 4 over time.

Referring to FIGS. 2 through 5, the OLED display 1 according to the embodiment may include a substrate 100 having pixel areas and transistor areas, a buffer layer 110 located on the substrate 100, a semiconductor layer ACT located on the buffer layer 110 of each of the transistor areas, a gate electrode GAT insulated from the semiconductor layer ACT, a gate insulating layer 120 insulating the semiconductor layer ACT from the gate electrode GAT, an interlayer insulating film 130 disposed on the gate electrode GAT, source/drain electrodes SD insulated from the gate electrode GAT and electrically connected to the semiconductor layer ACT through contact holes CNT1, a planarization layer 150 located on the source/drain electrodes SD, a first electrode PE located on the planarization layer 150 and electrically connected to one of the source/drain electrodes SD, and a pixel defining layer PDL defining each pixel area through respective openings OP formed on the first electrode PE. The pixeled defining layer PDL may partially expose the first electrode PE.

The substrate 100 may be made of a transparent glass material containing $SiO_2$ as its main component. In some implementations, the substrate 100 may be made of a transparent plastic material. The transparent plastic material may be, for example, an insulating organic material such as polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), or cellulose acetate propionate (CAP).

The buffer layer 110 may be formed on the substrate 100 to ensure the smoothness of the substrate 100 and block the penetration of impurities. The buffer layer 110 may be a single layer such as a silicon oxide (SiOx) layer, a silicon nitride (SiNx) layer or a silicon oxynitride ($SiO_2Nx$) layer or may be a multilayer made up of these layers.

The semiconductor layer ACT may be on the buffer layer 110. The semiconductor layer ACT may be made of silicon (Si), for example, amorphous silicon (a-Si) or polysilicon (p-Si). In some implementations, the semiconductor layer ACT may be made of, for example, germanium (Ge), gallium phosphide (GaP), gallium arsenide (GaAs), or aluminum arsenide (AlAs). In some implementations, the semiconductor layer ACT may be a silicon semiconductor layer formed by diffusing n-type impurities to a silicon-on-insulator (SOI) substrate at a low concentration. In some implementations, the semiconductor layer ACT may be formed by doping a portion of a-Si doped with p-type or n-type impurities.

The gate insulating layer 120 may be on the semiconductor layer ACT to cover the semiconductor layer ACT and to insulate the semiconductor layer ACT from the gate electrode GAT. Like the buffer layer 110, the gate insulating layer 120 may be a SiOx layer, a SiNx layer, or a $SiO_2Nx$ layer, or may be a multilayer made of these layers. The gate insulating layer 120 may be made of the same material as the buffer layer 110 or may be made of a different material from the buffer layer 110.

The gate electrode GAT may be formed on the gate insulating layer 120. The gate electrode GAT may control light emission of each pixel PX by transmitting a gate signal. The gate electrode GAT may be a single layer of an aluminum alloy such as aluminum (Al), chromium-aluminum (Cr—Al), molybdenum-aluminum (Mo—Al) or aluminum-neodymium (Al—Nd) or may be in a form of a multilayer including an Al alloy stacked on a Cr or Mo alloy.

The interlayer insulating film 130 may be on the gate electrode GAT. The interlayer insulating film 130 may electrically insulate the gate electrode GAT from the source/drain electrodes SD. Like the buffer layer 110, the interlayer insulating film 130 may be a SiOx layer, a SiNx layer or a $SiO_2Nx$ layer, or may be a multilayer including these layers.

The source/drain electrodes SD electrically connected to the semiconductor layer ACT may be formed on the interlayer insulating film 130. The source/drain electrodes SD may be made of, for example, any one of Mo, Cr, tungsten (W), molybdenum tungsten (MoW), Al, Al—Nd, titanium (TiN), titanium nitride (TiN), copper (Cu), a Mo alloy, an Al alloy, and a Cu alloy. The source/drain electrodes SD may be electrically connected to each other by the semiconductor layer ACT and may apply a voltage to the first electrode PE.

An additional insulating layer 140 may be provided on the source/drain electrodes SD. The planarization layer 150 for substrate planarization may be provided on the insulating layer 140. The planarization layer 150 may be made of an organic acrylic material.

The first electrode PE may be located on the planarization layer 150 and may be electrically connected to the source/drain electrodes SD. The first electrode PE and one of the source/drain electrodes SD may be connected through a contact hole CNT2 penetrating the insulating layer 140 and the planarization layer 150. Therefore, a driving voltage can be applied from the source/drain electrodes SD to the first electrode PE.

The first electrode PE may be made of a transparent conductive material. The transparent conductive material may include one or more of indium tin oxide (ITO), indium zinc oxide (IZO), carbon nanotubes, a conductive polymer, and nanowires. The first electrode PE may be made of, for example, a mixture of one or more of the transparent conductive materials.

The pixel defining layer PDL for defining each pixel area may be formed on the first electrode PE. The pixel defining layer PDL may be formed on the entire substrate 100 to cover the planarization layer 150. The openings OP, each exposing a portion of the first electrode PE, may be formed in the pixel defining layer PDL to define the pixel areas. For example, the pixel defining layer PDL may overlap a portion of the first electrode PE including edges in a thickness direction TD. The pixel defining layer PDL may include at least one organic material selected from benzocyclobutene (BCB), polyimide (PI), polyamide (PA), acrylic resin, and phenolic resin.

When the planarization layer 150 and the pixel defining layer PDL are made of an organic material, outgassing may occur during a baking process or during driving due to moisture ($H_2O$), sulfur (S) and fluorine (F). The outgassing can oxidize an organic light emitting layer EDL, and each pixel area can be reduced over time. Accordingly, this can reduce the luminance and life of the OLED display 1 and increase the color deviation of the OLED display 1.

The pixel defining layer PDL may partially overlap by a light shielding member BM along the thickness direction TD, as will be described below. According to an embodiment, when seen in cross section, a center of the pixel defining layer PDL may match the center of the light shielding member BM along the thickness direction TD, such that a cross-sectional center of the pixel defining layer PDL matches that of the light shielding member BM. The width of the pixel defining layer PDL, for example, along a direction perpendicular to the thickness direction TD, may be less than the width of the light shielding member BM. The organic light emitting layer EDL overlapped by the light shielding member BM in the thickness direction may include a shadow portion SH in each section not overlapping the pixel defining layer PDL and a sub area SB in each section overlapping the pixel defining layer PDL.

If the pixel defining layer PDL were to have a large width, it could be difficult to secure a space for the shadow portion SH. For example, the pixel defining layer PDL may just be wide enough to secure a space for the shadow portion SH at edges of each pixel area, such that the actual size of each pixel area can be maintained constant. For example, the cross-sectional width of the pixel defining layer PDL may be about 3 μm to about 5 μm.

The OLED display 1 may further include an organic light emitting layer EDL, which is disposed on the first electrode PE of each pixel area, and a second electrode CE and a thin-film encapsulation layer TFE, which are formed on the organic light emitting layer EDL.

The first electrode PE may be an anode or a cathode of the organic light emitting layer EDL. When the first electrode PE is an anode, the second electrode CE may be a cathode. Embodiments will be described below based on the assumption that the first electrode PE is an anode and the second electrode CE is a cathode. However, in some implementations, the first electrode PE may be a cathode and the second electrode CE may be an anode.

The first electrode PE used as an anode may be made of a conductive material having a high work function. When the OLED display 1 is a bottom emission display, the first electrode PE may be made of a material such as ITO, IZO, ZnO or $In_2O_3$ or may be a stacked layer of these materials. When the OLED display 1 is a top emission display, the first electrode PE may further include a reflective layer made of Ag, Mg, Al, Pt, Pd, Au, Ni, Nd, Ir, Cr, Li, or Ca.

The organic light emitting layer EDL may be on the first electrode PE. The organic light emitting layer EDL may overlap the first electrode PE along the thickness direction TD in each opening OP of the pixel defining layer PDL. The organic light emitting layer EDL may be made of a high or low molecular weight organic material that uniquely emits any one of red light, green light and blue light. In some implementations, the organic light emitting layer EDL may be made of a mixture of high and low molecular weight materials. In some embodiments, the organic light emitting layer EDL may include a host material and a dopant material.

The second electrode CE may be formed on the pixel defining layer PDL. When the second electrode CE is used as a cathode, the second electrode CE may be made of a conductive material having a low work function. For example, the second electrode CE may be made of Ag, Mg, Al, Pt, Pd, Au, Ni, Nd, Ir, Cr, Li, or Ca.

In order to form the organic light emitting layer EDL using a deposition method, a mask (e.g., a fine metal mask (FMM)) having opening patterns corresponding to patterns of the organic light emitting layer EDL to be formed on the substrate 100 may be placed close to the substrate 100. A deposition material may be deposited on the substrate 100 through the mask to form the desired organic light emitting layer EDL. The organic light emitting layer EDL may include a first organic light emitting layer ED1 that emits red light, a second organic light emitting layer ED2 that emits green light, and a third organic light emitting layer ED3 that emits blue light.

The first organic light emitting layer ED1, the second organic light emitting layer ED2 and the third organic light emitting layer ED3 may be sequentially stacked on the first electrodes PE and the pixel defining layer PDL through an FMM. Different organic light emitting layers adjacent to each other may partially overlap each other in the thickness direction TD on the pixel defining layer PDL. Each organic light emitting layer may include a main area MA and the sub area SB. The main area MA of each organic light emitting layer is a section in which the organic light emitting layer overlaps the first electrode PE in the thickness direction TD and directly contacts the first electrode PE. The sub area SB of each organic light emitting layer is a section that overlaps the pixel defining layer PDL in the thickness direction TD and directly contacts the pixel defining layer PDL.

The main area MA may include an open portion OPN that does not overlap the light shielding member BM in the thickness direction and the shadow portion SH, which overlaps the light shielding member BM. The shadow portion SH may change from a light emitting area to a non-light emitting area as time elapses.

When an electric field is formed between the first electrode PE and the second electrode CE, an organic light emitting layer may receive holes from the first electrode PE and electrons from the second electrode CE. The holes and the electrons transported to the organic light emitting layer may combine together to form excitons in an excited state. Energy transfer may occur between a host and a dopant when the excitons are moved by diffusion, and light may be emitted as the excitons fall to a ground state.

However, if the organic light emitting layer is oxidized over time by moisture ($H_2O$) or fluorine (F) generated from the planarization layer 150 or the pixel defining layer PDL made of an organic material, light emitted from the organic light emitting layer may gradually decrease. Eventually, the organic light emitting layer may change to a non-light emitting layer that does not emit light.

The sub area SB may include a region in which a single organic light emitting layer is disposed and a region in which two or more different organic light emitting layers overlap each other. The cross section of the pixel defining layer PDL illustrated in FIGS. 3 through 5 is rectangular. However, in some implementations, the cross-sectional shape of the pixel defining layer PDL may be another shape, such as a trapezoidal shape. In this case, a single organic light emitting layer may be disposed on inclined surfaces of the trapezoid, and two different organic light emitting layers may be disposed on an upper surface of the trapezoid to overlap each other. In the sub area SB, the region in which a single organic light emitting layer is disposed may change from a weak light emitting region to a non-light emitting region as time elapses. In addition, the region in which two or more different organic light emitting layers overlap each other along the thickness direction TD may be a non-light emitting region.

The distance between the first electrode PE and the second electrode CE along the thickness direction may be greater in the region in which a single organic light emitting layer is disposed in the sub area SB than in a pixel area. Accordingly, the voltage required by the organic light emitting layer to emit light may be greater in the region in which a single organic light emitting layer is disposed. Therefore, even if the same voltage is applied to the main area MA and this region of the sub area SB, less light may be emitted from the region in which a single organic light emitting layer is disposed.

In addition, as described above, if the organic light emitting layer is oxidized over time by $H_2O$ or F generated from the planarization layer 150 or the pixel defining layer PDL made of an organic material, light emitted from the organic light emitting layer may gradually decrease. Eventually, the organic light emitting layer may change to a non-light emitting layer that does not emit light.

In the sub area SB, the region in which two or more different organic light emitting layers overlap each other along the thickness direction TD may be a non-light emitting region SP. When two different organic light emitting layers overlap each other, holes transported from the first electrode PE and electrons transported from the second electrode CE may not be easily combined, and a greater voltage may be required for light emission. In some instances, light may not be emitted.

According to an embodiment, mixed light may be emitted from the sub area SB of each organic light emitting layer. For example, when the first organic light emitting layer ED1 emitting red light and the second organic light emitting layer ED2 emitting green light overlap each other along the thickness direction TD, weak yellow light may be emitted. When the second organic light emitting layer ED2 emitting green light and the third organic light emitting layer ED3 emitting blue light overlap each other, weak cyan light may be emitted. When the first organic light emitting layer ED1 emitting red light and the third organic light emitting layer ED3 emitting blue light overlap each other, weak magenta light may be emitted.

In the sub area SB, two or more different organic light emitting layers may overlap each other along the thickness direction TD on an upper surface of the pixel defining layer PDL. In some implementations, two or more different organic light emitting layers may also overlap each other along the thickness direction TD not only on the upper surface of the pixel defining layer PDL but also on both side surfaces of the pixel defining layer PDL.

Each organic light emitting layer overlapping the light shielding member BM along the thickness direction TD may include the shadow portion SH and the sub area SB. The length of each organic light emitting layer overlapping the light shielding member BM in the thickness direction TD may vary according to the aperture ratio of the organic light emitting layer and the resolution of the display 1. For example, the length of each organic light emitting layer overlapping the light shielding member BM in the thickness direction TD may decrease as the aperture ratio of the organic light emitting layer and the resolution of the display 1 increase. For example, the length of each organic light emitting layer overlapping the light shielding member BM in the thickness direction TD may be about 0.1 μm to about 18 μm.

When the organic light emitting layer EDL is deposited through a mask, an organic material may be insufficiently deposited in an edge portion of each organic light emitting layer to be formed. If this phenomenon were to occur in the main area MA, a light emitting area could be reduced.

However, according to an implementation, an edge portion of the main area MA corresponds to the shadow portion SH. Accordingly, the organic material may be insufficiently deposited in the shadow portion SH, which is an area assumed to eventually change to a non-pixel area NPX as time elapses. Therefore, the insufficient deposition of the organic material may not be of concern.

The thin-film encapsulation layer TFE may be disposed on the second electrode CE. The thin-film encapsulation layer TFE may encapsulate the organic light emitting layer EDL and may prevent impurities such as moisture or air from being introduced from outside the display 1 to damage or denature the organic light emitting layer EDL. In an embodiment, the thin-film encapsulation layer TFE may include one or more inorganic encapsulation layers 161 and 163 and one or more organic encapsulation layers 162. The inorganic encapsulation layers 161 and 163 and the organic encapsulation layers 162 may be alternately disposed. For example, the thin-film encapsulation layer TFE may include a first inorganic encapsulation layer 161 disposed on the second electrode CE, an organic encapsulation layer 162 disposed on the first inorganic encapsulation layer 161, and a second inorganic encapsulation layer 163 disposed on the organic encapsulation layer 162. The thin-film encapsulation layer TFE is shown in FIG. 2 as being made up of three layers. In some implementations, the thin-film encapsulation layer TFE may further include an encapsulation layer made of a siloxane-based material such as hexamethyldisiloxane.

The substrate 100 may include pixel areas PX1 through PX3 and non-pixel areas NPX. Each of the non-pixel areas NPX may be a non-light emitting area into which the shadow portion SH and the sub area SB described above are changed over time. Each of the pixel areas PX1 through PX3 may be an area where a pixel as a minimum unit for displaying an image is located. The pixel electrode PE may be located in each of the pixel areas PX1 through PX3. A switching element may be located in each of the non-pixel areas NPX. The switching element may be, for example, a thin-film transistor.

The light shielding member BM may overlap each thin-film transistor including the gate electrode GAT, the semiconductor layer ACT and the source/drain electrodes SD, the contact holes CNT1 and CNT2, and the pixel defining layer PDL along the thickness direction TD. The light shielding member BM may include a light shielding pigment such as black carbon and may include a photosensitive organic material. In some implementations, the light shielding member BM may also include an inorganic reflective/absorbing layer or a metal. For example, the light shielding member BM may be made of Al or Ag, which is a metal having high reflectance. The light shielding member BM formed as a reflective metal layer may totally reflect incident light, thereby improving light efficiency as compared with when formed of a light absorbing material.

The light shielding member BM may block mixed light that the sub area SB emits until the sub area SB changes from a weak light emitting area to a non-light emitting area. The light shielding member BM may be formed at an angle and distance for blocking mixed light emitted from the sub area SB. For example, when an area that emits mixed light is constant, a viewing angle at which the mixed light can be recognized may be constant. When the viewing angle is constant, the width along a direction perpendicular to the thickness direction TD of the light shielding member BM for blocking mixed light may be reduced as the distance between the mixed light emitting area and the light shielding member BM decreases. For example, the smaller the height of the organic layer in the thickness direction TD, the smaller the width of the light shielding member BM along a direction perpendicular to the thickness direction TD to block the mixed light. The viewing angle at which the mixed light can be recognized may be defined as an included angle θ1 between a line extending in a direction perpendicular to the substrate 100 and an imaginary line connecting a side surface of the mixed light emitting area and a side surface of the light shielding member BM.

When the viewing angle is constant, the width of the light shielding member BM for blocking mixed light may be increased as the distance between the mixed light emitting area and the light shielding member BM increases. For example, the greater the height of the organic layer, the greater the width of the light shielding member BM to block the mixed light.

In addition, when the height of the organic layer is constant, if the viewing angle at which mixed light can be recognized is widened because two different organic light emitting layers are not only on the upper surface of the pixel defining layer PDL but also on both side surfaces of the pixel defining layer PDL, the width of the light shielding member BM may be increased to block the mixed light.

Hereinafter, elements identical to those of the above-described embodiment will be indicated by the same reference numerals. In addition, any redundant description will not be repeated, and differences will be mainly described.

Figure 6:
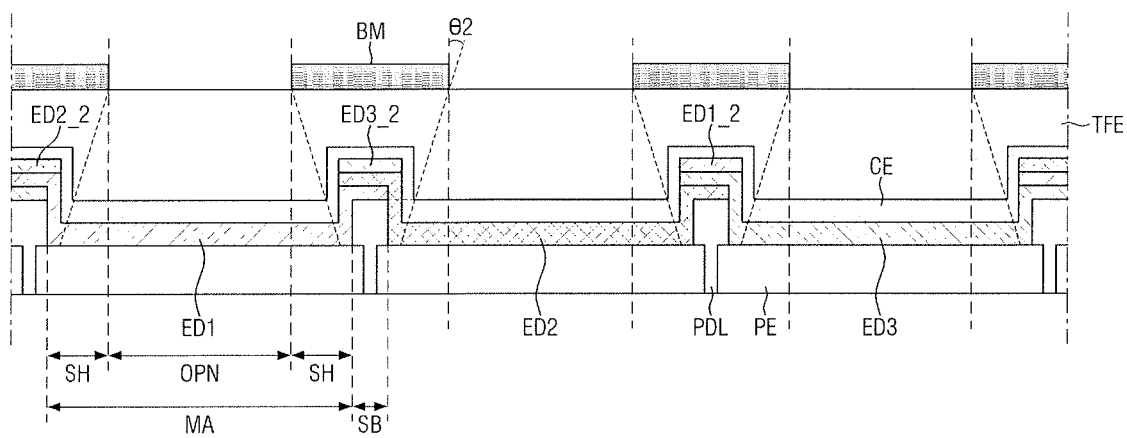
FIGS. 6 and 7 illustrate enlarged views of an OLED display according to an embodiment, taken along the area A of FIG. 2.
Figure 7:
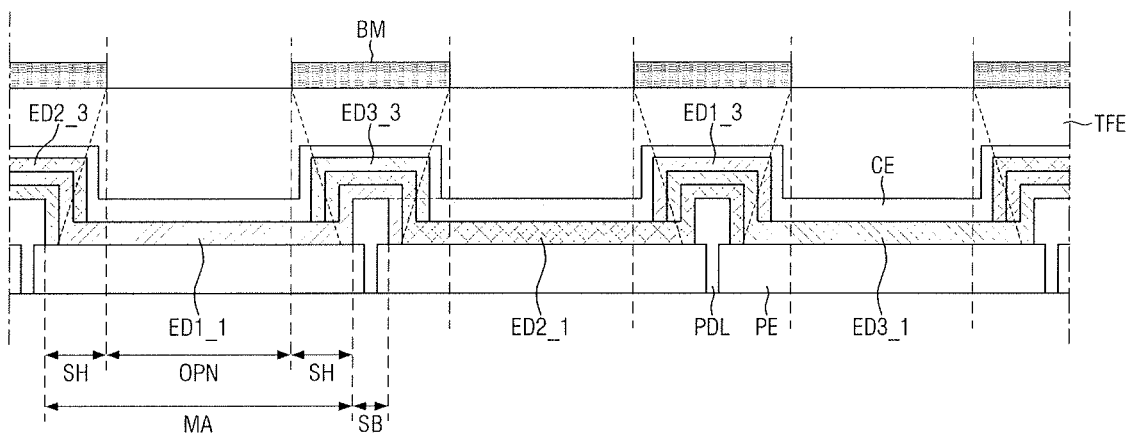
Figure 8:
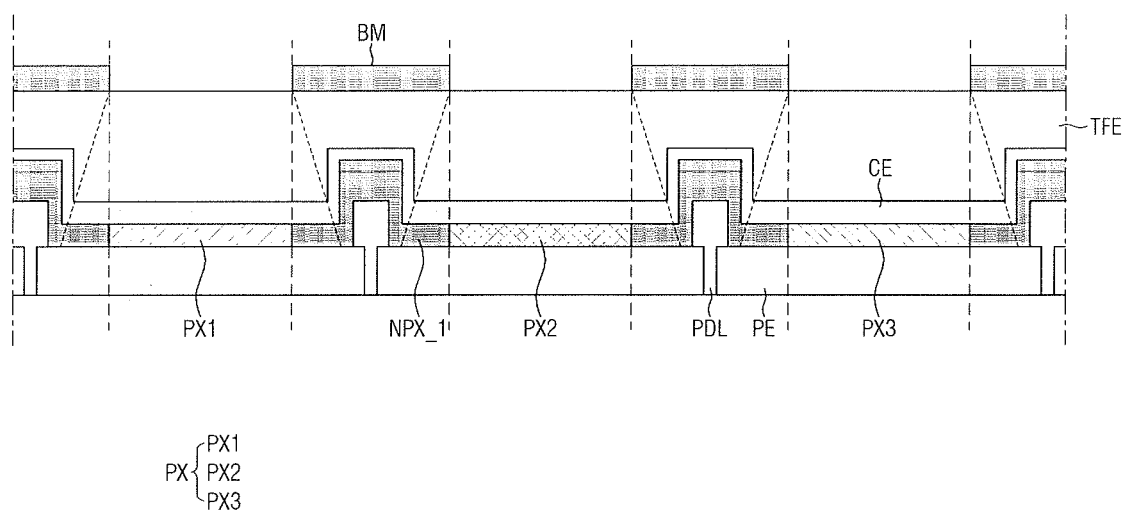
FIG. 8 illustrates a change in the OLED display of FIG. 6 or 7 over time.

FIGS. 6 and 7 illustrate enlarged views of an OLED display according to an embodiment, taken along the area A of FIG. 2. FIG. 8 illustrates a change in the OLED display of FIG. 6 or 7 over time.

Referring to FIGS. 6 through 8, the current embodiment differs from the embodiment of FIGS. 3 through 5 in that a first organic light emitting layer ED1, a second organic light emitting layer ED2, and a third organic light emitting layer ED3 are all stacked on a pixel defining layer PDL. For example, organic light emitting layers of adjacent pixels extend along respective levels of the pixel defining layer facing that pixel and along an upper surface of the pixel defining layer PDL For example, in the OLED display according to the current embodiment, the first organic light emitting layer ED1, the second organic light emitting layer ED2 and the third organic light emitting layer ED3 may be sequentially stacked on pixel electrodes and the pixel defining layer PDL through an FMM, and two different organic light emitting layers adjacent to each other may be stacked on the pixel defining layer PDL to partially overlap each other in the thickness direction TD. Another organic light emitting layer ED1_2, ED_2 or ED3_2 different from the two organic light emitting layers overlapping each other may be further stacked on the two organic light emitting layers.

Each organic light emitting layer may include a main area MA and a sub area SB. The main area MA of each organic light emitting layer may be a section in which the organic light emitting layer overlaps a first electrode PE in the thickness direction TD and directly contacts the first electrode PE. The sub area SB of each organic light emitting layer may be a section that overlaps the pixel defining layer PDL in the thickness direction TD and directly contacts the pixel defining layer PDL.

The main area MA may include an open portion OPN that does not overlap a light shielding member BM in the thickness direction TD and a shadow portion SH that overlaps the light shielding member BM in the thickness direction TD. The shadow portion SH may change from a light emitting area to a non-light emitting area as time elapses.

When an electric field is formed between the first electrode PE and a second electrode CE, an organic light emitting layer may receive holes from the first electrode PE and electrons from the second electrode CE. The holes and the electrons transported to the organic light emitting layer may combine together to form excitons in the excited state. Energy transfer may occur between a host and a dopant when the excitons are moved by diffusion, and light may be emitted as the excitons fall to the ground state.

However, if the organic light emitting layer is oxidized over time by $H_2O$ or F generated from a planarization layer or the pixel defining layer PDL made of an organic material, light emitted from the organic light emitting layer may gradually decrease. Eventually, the organic light emitting layer may change to a non-light emitting layer that does not emit light.

The sub area SB may include a region in which a single organic light emitting layer is disposed and a region in which two or more different organic light emitting layers overlap each other. The cross section of the pixel defining layer PDL illustrated in FIGS. 6 through 8 is shown as being rectangular. In some implementations, the cross section of the pixel defining layer PDL may other shapes, such as a trapezoidal shape. In this case, a single organic light emitting layer may be on inclined surfaces of the trapezoid, and three different organic light emitting layers overlapping each other may be on an upper surface of the trapezoid. In the sub area SB, the region in which a single organic light emitting layer is disposed may change from a weak light emitting region to a non-light emitting region as time elapses. In addition, the region in which three different organic light emitting layers overlap each other may be a non-light emitting region.

The distance between the first electrode PE and the second electrode CE may be greater in the region in which a single organic light emitting layer is in the sub area SB than in a pixel area. Accordingly, the voltage required by the organic light emitting layer to emit light may be greater in the sub area SB. Therefore, even if the same voltage is applied to the main area MA and this region of the sub area SB, less light may be emitted from the sub area SB.

If the organic light emitting layer is oxidized over time by $H_2O$ or F generated from the planarization layer or the pixel defining layer PDL made of an organic material, light emitted from the organic light emitting layer may gradually decrease. Eventually, the organic light emitting layer may change to a non-light emitting layer that does not emit light.

In the sub area SB, the region in which two or more different organic light emitting layers overlap each other in the thickness direction TD may be a non-light emitting region. When three different organic light emitting layers overlap each other along the thickness direction TD, holes transported from the first electrode PE and electrons transported from the second electrode CE may not be easily combined, and a greater voltage may be required for light emission. Therefore, light may not be emitted.

According to an embodiment, mixed light may be emitted from the sub area SB of each organic light emitting layer. For example, when the first organic light emitting layer ED1 emitting red light, the second organic light emitting layer ED2 emitting green light, and the third organic light emitting layer ED3 emitting blue light overlap each other along the thickness direction TD, weak white light may be emitted. In the sub area SB, three different organic light emitting layers may overlap each other along the thickness direction on an upper surface of the pixel defining layer PDL. Referring to FIG. 7, in some implementations, three different organic light emitting layers ED1_1, ED2_1 and ED3_1 may overlap each other along the thickness direction TD not only on the upper surface of the pixel defining layer PDL but also on both side surfaces of the pixel defining layer PDL.

Each organic light emitting layer overlapping the light shielding member BM may include the shadow portion SH and the sub area SB. The length of each organic light emitting layer overlapping the light shielding member BM in the thickness direction TD may vary according to the aperture ratio of the organic light emitting layer and the resolution of the display. For example, the length of each organic light emitting layer overlapping the light shielding member BM in the thickness direction TD may decrease as the aperture ratio of the organic light emitting layer and the resolution of the display increase. For example, the length in a direction perpendicular to the thickness direction TD of each organic light emitting layer overlapping the light shielding member BM in the thickness direction TD may be about 0.1 μm to about 18 μm.

When an organic light emitting layer EDL is deposited through a mask, an organic material may be insufficiently deposited in an edge portion of each organic light emitting layer to be formed. If this phenomenon occurs in the main area MA, a light emitting area may be reduced.

However, in the present disclosure, an edge portion of the main area MA corresponds to the shadow portion SH, and the organic material may be insufficiently deposited in the shadow portion SH. The shadow portion SH is an area assumed to eventually change to a non-pixel area NPX_1 as time elapses. Therefore, the insufficient deposition of the organic material may not be of concern.

A substrate 100 may include pixel areas PX1 through PX3 and non-pixel areas NPX_1. Each of the non-pixel areas NPX_1 may be a non-light emitting area into which the shadow portion SH and the sub area SB described above are changed over time. Each of the pixel areas PX1 through PX3 may be an area where a pixel as a minimum unit for displaying an image is located. The pixel electrode PE may be located in each of the pixel areas PX1 through PX3. A switching element may be located in each of the non-pixel areas NPX_1. The switching element may be, for example, a thin-film transistor.

The light shielding member BM may overlap each thin-film transistor including a gate electrode GAT, a semiconductor layer ACT and source/drain electrodes SD, contact holes CNT1 and CNT2, and the pixel defining layer PDL along the thickness direction TD. The light shielding member BM may include a light shielding pigment such as black carbon and may include a photosensitive organic material. In some implementations, the light shielding member BM may include an inorganic reflective/absorbing layer or a metal. For example, the light shielding member BM may be made of Al or Ag, which is a metal having high reflectance. The light shielding member BM formed as a reflective metal layer may totally reflect incident light, thereby improving light efficiency as compared with when formed of a light absorbing material.

The light shielding member BM may block mixed light that the sub area SB emits until the sub area SB changes from a weak light emitting area to a non-light emitting area. The light shielding member BM may be formed at an angle and distance for blocking mixed light emitted from the sub area SB. For example, when an area that emits mixed light is constant, a viewing angle at which the mixed light can be recognized may be constant. When the viewing angle is constant, the width in a direction perpendicular to the thickness direction of the light shielding member BM for blocking mixed light may be reduced as the distance between the mixed light emitting area and the light shielding member BM in the thickness direction TD decreases. For example, the smaller the height of the organic layer in the thickness direction TD, the smaller the width in a direction perpendicular to the thickness direction TD of the light shielding member BM required to block the mixed light. The viewing angle at which the mixed light can be recognized is defined as an included angle θ1 between a line extending in a direction perpendicular to the substrate 100 and an imaginary line connecting a side surface of the mixed light emitting area and a side surface of the light shielding member BM.

When the viewing angle is constant, the width in a direction perpendicular to the thickness direction TD of the light shielding member BM for blocking mixed light may be increased as the distance between the mixed light emitting area and the light shielding member BM in the thickness direction TD increases. For example, the greater the height of the organic layer in the thickness direction TD, the greater the width in a direction perpendicular to the thickness direction of the light shielding member BM to block the mixed light.

When the height of the organic layer in the thickness direction TD is constant, if the viewing angle at which mixed light can be recognized is widened because two different organic light emitting layers are disposed not only on the upper surface of the pixel defining layer PDL but also on both side surfaces of the pixel defining layer PDL, the width of the light shielding member BM in a direction perpendicular to the thickness direction TD may be increased to block the mixed light.

The sub area SB in which three different organic light emitting layers overlap each other in the thickness direction TD may emit weak white light. Accordingly, issues that could occur due to luminance/color deviation caused by color mixing may be reduced.

Figure 9:
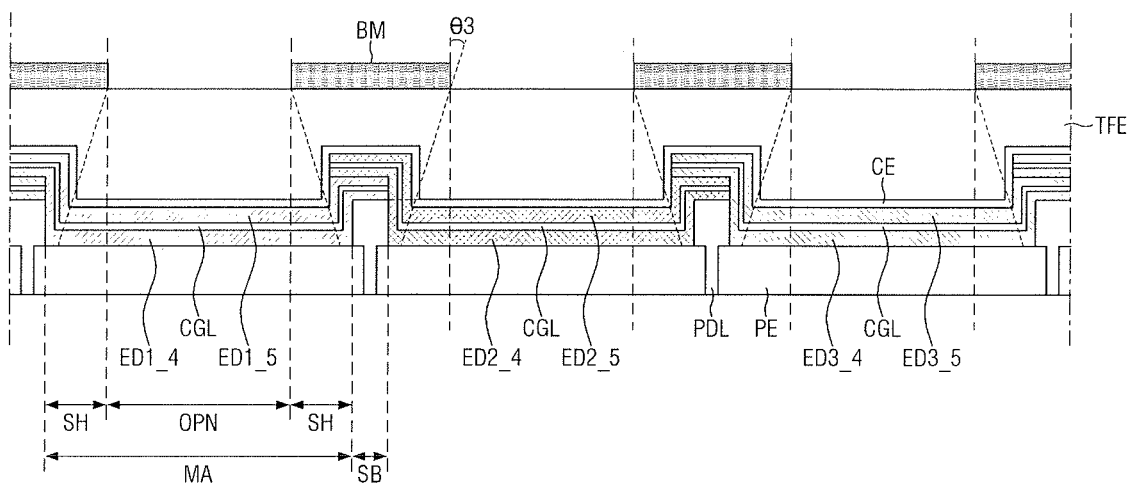
FIGS. 9 and 10 illustrate enlarged views of an OLED display according to an embodiment, taken along the area A of FIG. 2.
Figure 10:
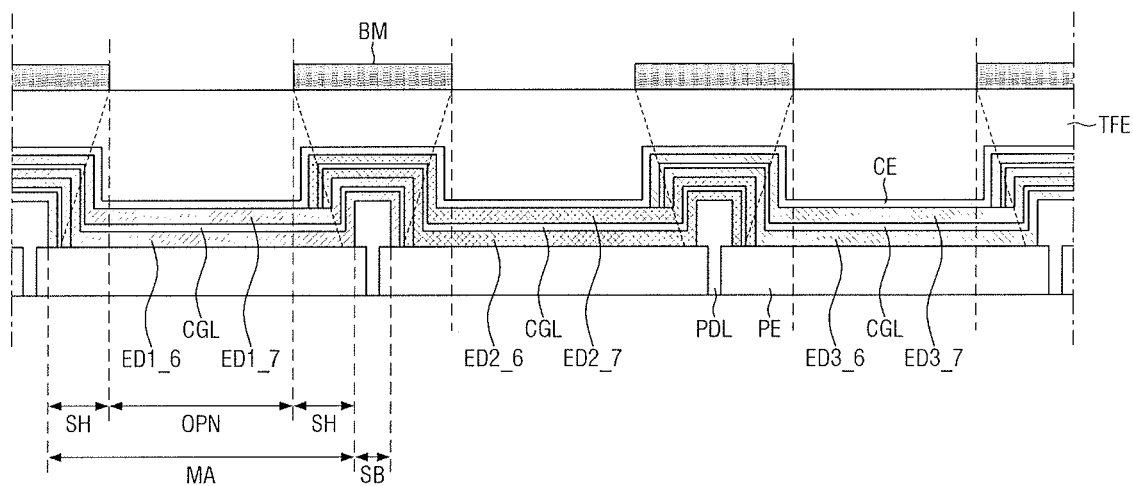
Figure 11:
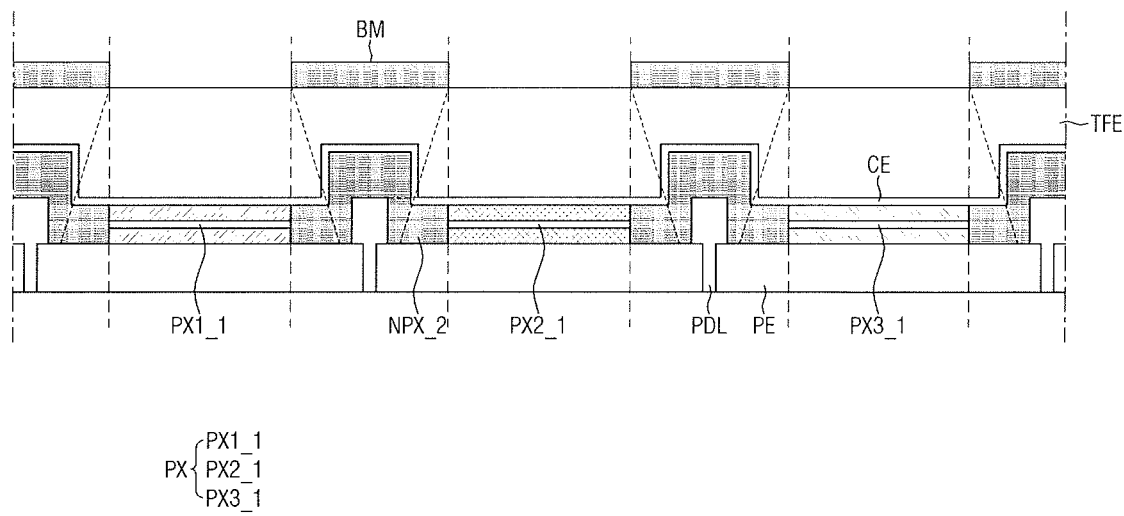
FIG. 11 illustrates a change in the OLED display of FIG. 9 or 10 over time.

FIGS. 9 and 10 illustrate enlarged views of an OLED display according to an embodiment, taken along the area A of FIG. 2. FIG. 11 illustrates a change in the OLED display of FIG. 9 or 10 over time.

Referring to FIGS. 9 through 11, the current embodiment differs from the embodiment of FIGS. 3 and 4 in that each organic light emitting layer has a tandem stacked structure.

For example, a first organic light emitting layer ED1 of the OLED display according to the current embodiment may further include a charge generation layer CGL located on a first light emitting layer ED1_4 and a second light emitting layer ED1_5 located on the charge generation layer CGL. A second medium layer may be located on the second light emitting layer ED1_5.

The charge generation layer CGL may inject charges into each light emitting layer. The charge generation layer CGL may adjust the charge balance between the first light emitting layer ED1_4 and the second light emitting layer ED1_5. In some embodiments, the charge generation layer CGL may include an n-type charge generation layer and a p-type charge generation layer. The p-type charge generation layer may be disposed on the n-type charge generation layer.

The charge generation layer CGL may have a structure in which the n-type charge generation layer and the p-type charge generation layer are bonded to each other. The n-type charge generation layer may be disposed closer to a first electrode PE among the first electrode PE and a second electrode CE. The p-type charge generation layer may be disposed closer to the second electrode CE among the first electrode PE and the second electrode CE. The n-type charge generation layer may supply electrons to the first light emitting layer ED1_4 adjacent to the first electrode PE, and the p-type charge generation layer may supply holes to the second light emitting layer ED1_5. When the charge generation layer CGL disposed between the first light emitting layer ED1_4 and the second light emitting layer ED1_5 provides charges to each of the first light emitting layer ED1_4 and the second light emitting layer ED1_5, luminous efficiency can be improved, and a driving voltage can be lowered.

Like the first light emitting layer ED1_4, the second light emitting layer ED1_5 may emit red light. In some embodiments, red light emitted from the second light emitting layer ED1_5 and red light emitted from the first light emitting layer ED1_4 may have the same peak wavelength range. In some embodiments, the second light emitting layer ED1_5 may be made of the same material as the first light emitting layer ED1_4 or may include one or more of the materials exemplified as the material of the first light emitting layer ED1_4. In some embodiments, the first light emitting layer ED1_4 and the second light emitting layer ED1_5 may be made of different materials, and red light emitted from the first light emitting layer ED1_4 and red light emitted from the second light emitting layer ED1_5 may have different peak wavelength ranges.

The first organic light emitting layer ED1 structured as described above may include two light emitting layers, for example, the first light emitting layer ED1_4 and the second light emitting layer ED1_5. The first light emitting layer ED1_4 and the second light emitting layer ED1_5 may be red light emitting layers. A second light emitting layer ED2 may include two light emitting layers, for example, a first light emitting layer ED2_4 and a second light emitting layer ED2_5. The first light emitting layer ED2_4 and the second light emitting layer ED2_5 may be green light emitting layers. A third organic light emitting layer ED3 may include two light emitting layers, for example, a first light emitting layer ED3_4 and a second light emitting layer ED3_5. The first light emitting layer ED3_4 and the second light emitting layer ED3_5 may be blue light emitting layers.

The first organic light emitting layer ED1, the second organic light emitting layer ED2 and the third organic light emitting layer ED3, each including two light emitting layers, may be sequentially stacked on pixel electrodes and a pixel defining layer PDL through an FMM. Two different organic light emitting layers adjacent to each other may partially overlap each other on the pixel defining layer PDL.

Each organic light emitting layer may include a main area MA and a sub area SB. The main area MA of each organic light emitting layer may be a section in which the organic light emitting layer overlaps the first electrode PE in the thickness direction TD and directly contacts the first electrode PE. The sub area SB of each organic light emitting layer may be a section that overlaps the pixel defining layer PDL in the thickness direction TD and directly contacts the pixel defining layer PDL.

The main area MA may include an open portion OPN that does not overlap a light shielding member BM in the thickness direction TD and a shadow portion SH that overlaps the light shielding member BM in the thickness direction TD. The shadow portion SH may change from a light emitting area to a non-light emitting area as time elapses.

For example, when an electric field is formed between the first electrode PE and the second electrode CE, the first light emitting layer ED1_4 may receive holes from the first electrode PE and electrons from the charge generation layer CGL. The second light emitting layer ED1_5 may receive holes from the charge generation layer CGL and electrons from the second electrode CE. The holes and the electrons transported to the first and second light emitting layers ED1_4 and ED1_5 may combine together to form excitons in the excited state. Energy transfer may occur between a host and a dopant when the excitons are moved by diffusion, and light may be emitted as the excitons fall to the ground state.

If an organic light emitting layer is oxidized over time by $H_2O$ or F generated from a planarization layer or the pixel defining layer PDL made of an organic material, light emitted from the organic light emitting layer may gradually decrease. Eventually, the organic light emitting layer may change to a non-light emitting layer that does not emit light.

The sub area SB may include a region in which a single organic light emitting layer including two light emitting layers is disposed and a region in which two different organic light emitting layers, each including two light emitting layers, overlap each other in the thickness direction TD. The cross section of the pixel defining layer PDL illustrated in FIGS. 9 through 11 may be rectangular. In some implementations, the cross-sectional shape of the pixel defining layer PDL may be other shapes, such as, for example, a trapezoidal shape. In this case, an organic light emitting layer including two light emitting layers may be disposed on inclined surfaces of the trapezoid, and two different organic light emitting layers, each including two light emitting layers, may be disposed on an upper surface of the trapezoid to overlap each other in the thickness direction TD. In the sub area SB, the region in which a single organic light emitting layer including two light emitting layers is disposed may change from a weak light emitting region to a non-light emitting region as time elapses. In addition, the region in which two different organic light emitting layers, each including two light emitting layers, overlap each other may be a non-light emitting region.

The distance between the first electrode PE and the second electrode CE may be greater in the region in which a single organic light emitting layer including two light emitting layers is disposed in the sub area SB than in a pixel area. Accordingly, the voltage required by the organic light emitting layer to emit light may be greater in the region in which the sub area SB is disposed. Therefore, even if the same voltage is applied to the main area MA and the sub area SB, less light may be emitted from the sub area SB. In addition, as described above, if the organic light emitting layer is oxidized over time by $H_2O$ or F generated from the planarization layer or the pixel defining layer PDL made of an organic material, light emitted from the organic light emitting layer may gradually decrease. Eventually, the organic light emitting layer may change to a non-light emitting layer that does not emit light.

In the sub area SB, the region in which two different organic light emitting layers, each including two light emitting layers, overlap each other may be a non-light emitting region. When two different organic light emitting layers, each including two light emitting layers, overlap each other in the thickness direction TD, holes and electrons may not be easily combined between the different organic light emitting layers, and a greater voltage may be required for light emission. Therefore, light may not be emitted.

According to an embodiment, mixed light may be emitted from the sub area SB of each organic light emitting layer. For example, when the first organic light emitting layer ED1 emitting red light and the second organic light emitting layer ED2 emitting green light overlap each other in the thickness direction TD, weak yellow light may be emitted. When the second organic light emitting layer ED2 emitting green light and the third organic light emitting layer ED3 emitting blue light overlap each other in the thickness direction TD, weak cyan light may be emitted. When the first organic light emitting layer ED1 emitting red light and the third organic light emitting layer ED3 emitting blue light overlap each other in the thickness direction TD, weak magenta light may be emitted. When two different organic light emitting layers, each including two light emitting layers between the first electrode PE and the second electrode CE, overlap each other in the thickness direction TD in the sub area SB of FIGS. 9 through 11, a greater driving voltage may be required than when two different organic light emitting layers, each including one light emitting layer, overlap each other in the thickness direction TD in the sub area SB as in FIGS. 3 through 8. Therefore, weaker mixed light may be emitted from the sub area SB of FIGS. 9 through 11. For example, referring to FIG. 9, four different organic light emitting layers ED1_4, ED1_5, ED2_4 and ED2_5 may overlap each other in the thickness direction only on an upper surface of the pixel defining layer PDL in the sub area SB. Referring to FIG. 10, four different organic light emitting layers ED1_6, ED1_7, ED2_6 and ED2_7 may overlap each other in the thickness direction not only on the upper surface of the pixel defining layer PDL but also on both side surfaces of the pixel defining layer PDL.

Each organic light emitting layer overlapping the light shielding member BM in the thickness direction TD may include the shadow portion SH and the sub area SB. The length of each organic light emitting layer overlapping the light shielding member BM in the thickness direction TD may vary according to the aperture ratio of the organic light emitting layer and the resolution of the display. For example, the length of each organic light emitting layer overlapping the light shielding member BM in the thickness direction TD may decrease as the aperture ratio of the organic light emitting layer and the resolution of the display increase. For example, the length of each organic light emitting layer overlapping the light shielding member BM in the thickness direction TD may be about 0.1 μm to about 18 μm.

When an organic light emitting layer EDL is deposited through a mask, an organic material may be insufficiently deposited in an edge portion of each organic light emitting layer to be formed. If this phenomenon occurs in the main area MA, a light emitting area may be reduced.

However, in the present disclosure an edge portion of the main area MA corresponds to the shadow portion SH. The organic material may be insufficiently deposited in the shadow portion SH. The shadow portion SH is an area assumed to eventually change to a non-pixel area NPX_2 as time elapses. Therefore, the insufficient deposition of the organic material may not be an issue.

A substrate 100 may include pixel areas PX1_1 through PX3_1 and non-pixel areas NPX_2. Each of the non-pixel areas NPX_2 may be a non-light emitting area into which the shadow portion SH and the sub area SB described above are changed over time. Each of the pixel areas PX1_1 through PX3_1 may be an area where a pixel as a minimum unit for displaying an image is located. The pixel electrode PE may be located in each of the pixel areas PX1_1 through PX3_1. A switching element may be located in each of the non-pixel areas NPX_2. The switching element may be, for example, a thin-film transistor.

The light shielding member BM may overlap in the thickness direction TD each thin-film transistor including a gate electrode GAT, a semiconductor layer ACT and source/drain electrodes SD, contact holes CNT1 and CNT2, and the pixel defining layer PDL. The light shielding member BM may include a light shielding pigment such as black carbon and may include a photosensitive organic material. In some implementations, the light shielding member BM may also include an inorganic reflective/absorbing layer or a metal. For example, the light shielding member BM may be made of Al or Ag, which is a metal having high reflectance. The light shielding member BM formed as a reflective metal layer may totally reflect incident light, thereby improving light efficiency as compared with when formed of a light absorbing material.

The light shielding member BM may block mixed light that the sub area SB emits until the sub area SB changes from a weak light emitting area to a non-light emitting area. The light shielding member BM may be formed at an angle and distance for blocking mixed light emitted from the sub area SB. For example, when an area that emits mixed light is constant, a viewing angle at which the mixed light can be recognized may be constant. When the viewing angle is constant, the width of the light shielding member BM for blocking mixed light may be reduced as the distance between the mixed light emitting area and the light shielding member BM decreases. For example, the smaller the height of the organic layer, the smaller the width of the light shielding member BM to block the mixed light. The viewing angle at which the mixed light can be recognized is defined as an included angle θ1 between a line extending in a direction perpendicular to the substrate 100 and an imaginary line connecting a side surface of the mixed light emitting area and a side surface of the light shielding member BM.

When the viewing angle is constant, the width of the light shielding member BM for blocking mixed light may be increased as the distance between the mixed light emitting area and the light shielding member BM increases. For example, the greater the height of the organic layer, the greater the width of the light shielding member BM to block the mixed light.

In addition, when the height of the organic layer is constant, if the viewing angle at which mixed light can be recognized is widened because two different organic light emitting layers are disposed not only on the upper surface of the pixel defining layer PDL but also on both side surfaces of the pixel defining layer PDL, the width of the light shielding member BM may be increased to block the mixed light.

The height in a thickness direction TD of an organic light emitting layer including two light emitting layers may be greater than that of an organic light emitting layer including one light emitting layer. Accordingly, the width of the light shielding member BM in a direction perpendicular to the thickness direction TD may be increased to block mixed light emitted from the organic light emitting layer including two light emitting layers. However, less light may be emitted from the organic light emitting layer including two light emitting layers than from the organic light emitting layer including one light emitting layer. Accordingly, the width in a direction perpendicular to the thickness direction TD of the light shielding member BM may be substantially the same.

Figure 12:
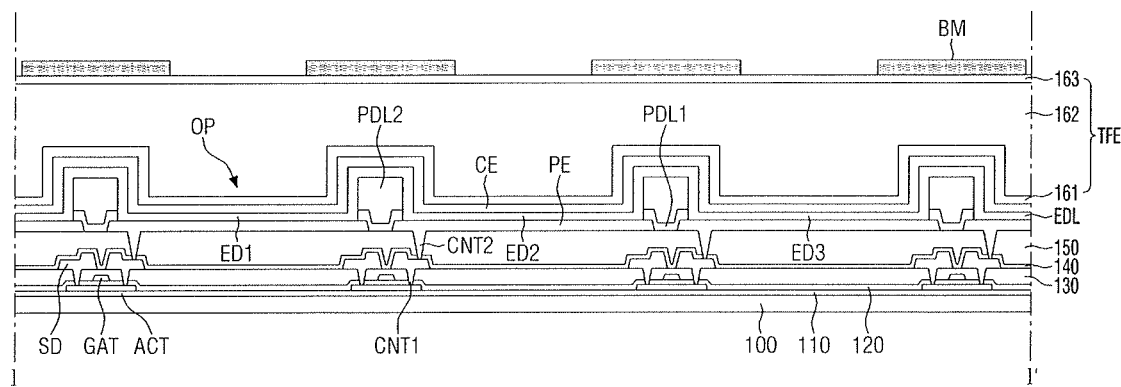
FIG. 12 illustrates a cross-sectional view of an OLED display according to an embodiment, taken along the line I-I' of FIG. 1.

FIG. 12 illustrates a cross-sectional view of an OLED display according to an embodiment, taken along the line I-I' of FIG. 1.

The embodiment of FIG. 12 differs from the embodiment of FIG. 2 in that a pixel defining layer PDL includes a first pixel defining layer PDL1 made of an inorganic material and a second pixel defining layer PDL2 made of an organic material.

For example, in the OLED display according to the embodiment, the first pixel defining layer PDL1 for defining each pixel area may be formed on each first electrode PE. The first pixel defining layer PDL1 may be formed on the entire substrate 100 to cover a planarization layer 150. Openings OP, each exposing a portion of the first electrode PE, may be formed in the first pixel defining layer PDL1 to define the pixel areas. The first pixel defining layer PDL1 may overlap a portion of each first electrode PE including edges in the thickness direction ID. The first pixel defining layer PDL1 may be made of an inorganic material such as a SiOx layer, a SiNx layer or a SiO₂Nx layer or may be in a form of a multilayer including these layers.

As described above, when the planarization layer 150 is made of an organic material, outgassing may occur during a baking process. The outgassing could oxidize a first medium layer for transporting electrons, thereby reducing each pixel area. For example, the life of the display might be reduced. However, if the first pixel defining layer PDL1 made of an inorganic material is disposed on the planarization layer 150 according to the embodiment, it may be possible to prevent the outgassing from the planarization layer 150, which, in turn, may improve the reliability, optical characteristics and life dispersion of the display.

The second pixel defining layer PDL2 may be disposed on an upper surface of the first pixel defining layer PDL1. The second pixel defining layer PDL2 may overlap the first pixel defining layer PDL1 in the thickness direction TD. A portion of each pixel electrode PE including edges, the first pixel defining layer PDL1, and the second pixel defining layer PDL2 may overlap each other in the thickness direction TD. The second pixel defining layer PDL2 may not be formed in each opening OP of the first pixel defining layer PDL1. Accordingly, a light emitting layer EDL may be exposed without being covered by the second pixel defining layer PDL2.

A sidewall of the first pixel defining layer PDL1 on the side of each opening OP and a sidewall of the second pixel defining layer PDL2 on the side of each opening OP may be aligned with each other. The thickness of the first pixel defining layer PDL1 may be constant.

The second pixel defining layer PDL2 may include at least one organic material selected from BCB, PI, PA, acrylic resin, and phenolic resin.

By way of summation and review, an OLED display may include a pixel defining layer that surrounds edges of each pixel electrode to form a boundary that separates a corresponding pixel from other pixels. An organic light emitting layer may be disposed on a pixel electrode within each opening of the pixel defining layer. The organic light emitting layer may be susceptible to degradation by moisture or oxygen, resulting in reduced luminance in some portions or creation of a non-light emitting area.

Embodiments provide an organic light emitting diode (OLED) display whose pixel structure is changed to minimize a reduction in a light emitting area An OLED display according to an embodiment may help to prevent a reduction in its luminance and life that could be due to a reduction in a light emitting area and may reduce color deviation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting diode (OLED) display, comprising:
   a first electrode;
   a pixel defining layer that at least partially exposes the first electrode;
   an organic light emitting layer on the first electrode;
   a thin-film encapsulation layer on the organic light emitting layer; and
   a light shielding member on the thin-film encapsulation the light shielding member overlapping the pixel defining layer, a width of the pixel defining layer being less than a width of the light shielding member, wherein:
   the organic light emitting layer includes a main area not overlapping the pixel defining layer and a sub area overlapping the pixel defining layer, and
   the main area includes an open portion not overlapping the light shielding member and a shadow portion around the open portion and overlapping the light shielding member.

2. The OLED display as claimed in claim 1, wherein: the pixel defining layer and the light shielding member overlap each other such that a cross-sectional center of the pixel defining layer matches that of the light shielding member.

3. The OLED display as claimed in claim 2, wherein the width of the pixel defining layer is about 3 µm to about 5 µm.

4. The OLED display as claimed in claim 1, wherein a width of the shadow portion is about 6.5 µm to about 7.5 µm.

5. The OLED display as claimed in claim 1, wherein the organic light emitting layer includes a first organic light emitting layer emitting red light, a second organic light emitting layer emitting green light, and a third organic light emitting layer emitting blue light.

6. The OLED display as claimed in claim 5, wherein, in the sub area,
   any one of the first through third organic light emitting layers is on a side surface and an upper surface of the pixel defining layer, and
   another one of the first through third organic light emitting layers is on another side surface and the upper surface of the pixel defining layer.

7. The OLED display as claimed in claim 5, wherein, in the sub area,
   any one of the first through third organic light emitting layers is on both side surfaces and an upper surface of the pixel defining layer, and another one of the first through third organic light emitting layers is on both side surfaces and the upper surface of the pixel defining layer.

8. The OLED display as claimed in claim 5, wherein the first through third organic light emitting layers overlap each other in the sub area.

9. The OLED display as claimed in claim 1, wherein the shadow portion and the sub area change to non-light emitting areas as time elapses.

10. The OLED display as claimed in claim 1, wherein a width of the light shielding member increases in proportion to a thickness of the thin-film encapsulation layer.

11. An OLED display, comprising:
    a first electrode;
    a pixel defining layer that at least partially exposes the first electrode;
    an organic light emitting layer that is on the first electrode;
    a thin-film encapsulation layer that is on the organic light emitting layer; and
    a light shielding member that is on the thin-film encapsulation layer and overlaps the pixel defining layer, a width of the pixel defining layer being less than a width of the light shielding member, wherein:
    the organic light emitting layer includes a main area not overlapping the pixel defining layer and a sub area overlapping the pixel defining layer, the main area including an open portion not overlapping the light shielding member and a shadow portion overlapping the light shielding member and disposed around the open portion, wherein the open portion is a strong light emitting area, and
    each of the shadow portion and the sub area is a weak light emitting area having a lower emission intensity than the strong light emitting area.

12. The OLED display as claimed in claim 11, wherein the emission intensity of the shadow portion is greater than that of the sub area.

13. The OLED display as claimed in claim 11, wherein the emission intensity of each of the shadow portion and the sub area decreases as a distance from the open portion increases.

14. An OLED display comprising:
    a first electrode;
    a pixel defining layer that at least partially exposes the first electrode;
    an organic light emitting layer on the first electrode, the organic light emitting layer including a first light emitting layer and a second light emitting layer;
    a thin-film encapsulation layer on the organic light emitting layer; and
    a light shielding member on the thin-film encapsulation, the light shielding member overlapping the pixel defining layer, a width of the pixel defining layer being less than a width of the light shielding member, wherein:
    the organic light emitting layer includes a main area not overlapping the pixel defining layer and a sub area overlapping the pixel defining layer, and
    the main area includes an open portion not overlapping the light shielding member and a shadow portion around the open portion overlapping the light shielding member.

15. The OLED display as claimed in claim 14, wherein the organic light emitting layer further includes a charge generation layer between the first light emitting layer and the second light emitting layer.

16. The OLED display as claimed in claim 14, wherein light emitted from the first light emitting layer and light emitted from the second light emitting layer have a same color and have different peak wavelength ranges.

17. The OLED display as claimed in claim 14, wherein: the pixel defining layer and the light shielding member overlap each other such that a cross-sectional center of the pixel defining layer matches that of the light shielding member.

18. The OLED display as claimed in claim 17, wherein the width of the pixel defining layer is about 3 μm to about 5 μm.

19. The OLED display as claimed in claim 14, wherein a width of the shadow portion is about 6.5 μm to about 7.5 μm.

20. The OLED display as claimed in claim 14, wherein the shadow portion and the sub area change to non-light emitting areas as time elapses.

* * * * *